(12) United States Patent
Monroe (10) Patent No.: US 6,653,898 B2
(45) Date of Patent: Nov. 25, 2003

(54) HIGH EFFICIENCY STAGE-SWITCHING CDMA POWER AMPLIFIER

(75) Inventor: Robert W. Monroe, Melissa, TX (US)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/752,903

(22) Filed: Dec. 28, 2000

(65) Prior Publication Data

US 2002/0084844 A1 Jul. 4, 2002

(51) Int. Cl.[7] ................................................. H03F 1/14
(52) U.S. Cl. ..................... 330/51; 330/124 R; 330/129; 330/136; 330/284
(58) Field of Search ............................... 330/51, 124 R, 330/129, 136, 284

(56) References Cited

U.S. PATENT DOCUMENTS

| 5,099,203 A | 3/1992 | Weaver et al. |
|---|---|---|
| 5,423,078 A | 6/1995 | Epperson et al. |
| 5,432,473 A | 7/1995 | Mattila et al. |
| 5,541,554 A * | 7/1996 | Stengel et al. ................. 330/51 |
| 5,752,172 A | 5/1998 | Matero |
| 6,064,857 A | 5/2000 | Wiedeman et al. |
| 6,107,880 A | 8/2000 | Shaw |
| 6,181,208 B1 * | 1/2001 | King et al. .................. 330/295 |
| 6,300,828 B1 * | 10/2001 | McInnis ................. 330/124 R |

\* cited by examiner

Primary Examiner—Michael B Shingleton (57) ABSTRACT

There is disclosed for use in a base station power amplifier a first and second amplifier stage for amplifying a received RF signal. A controller is provided that samples the incoming signal to determine its power level. If the signal power level is below a predetermined threshold, the controller directs the signal to the first amplifier stage which provides low power amplification. If the signal is above the threshold, the controller passes the signal to the second amplifier stage for high power amplification. Power efficiency is increased and DC power is reduced by switching off the unused amplifier stage.

17 Claims, 6 Drawing Sheets

HIGH EFFICIENCY STAGE-SWITCHING CDMA POWER AMPLIFIER

TECHNICAL FIELD OF THE INVENTION

The present invention is directed, in general, to power amplifier circuits in a base station and, more specifically, to a system for improving the efficiency of signal power amplification in a base station.

BACKGROUND OF THE INVENTION

Power amplifiers in a code division multiple access (CDMA) wireless communication system increase the strength of an input signal without appreciably altering other signal characteristics of the input signals. Because CDMA signals are a non-constant envelope, the signal peak to average ratio can be very large, on the order of 12 dB or more. This possibility for large peak power requires the power amplifiers to operate with a large amount of "backoff" from the optimum P1 dB point to maintain linear operation during peak power periods.

Power amplifiers with large backoffs exhibit extremely poor efficiency. Greatest efficiency is achieved at higher power levels nearest the gain compression point. Efficiency decreases proportionally to the square root of $P_{out}$ as $P_{out}$ is reduced from the 1 dB compression point (P1 dB) for class AB amplifiers.

Figure 6:
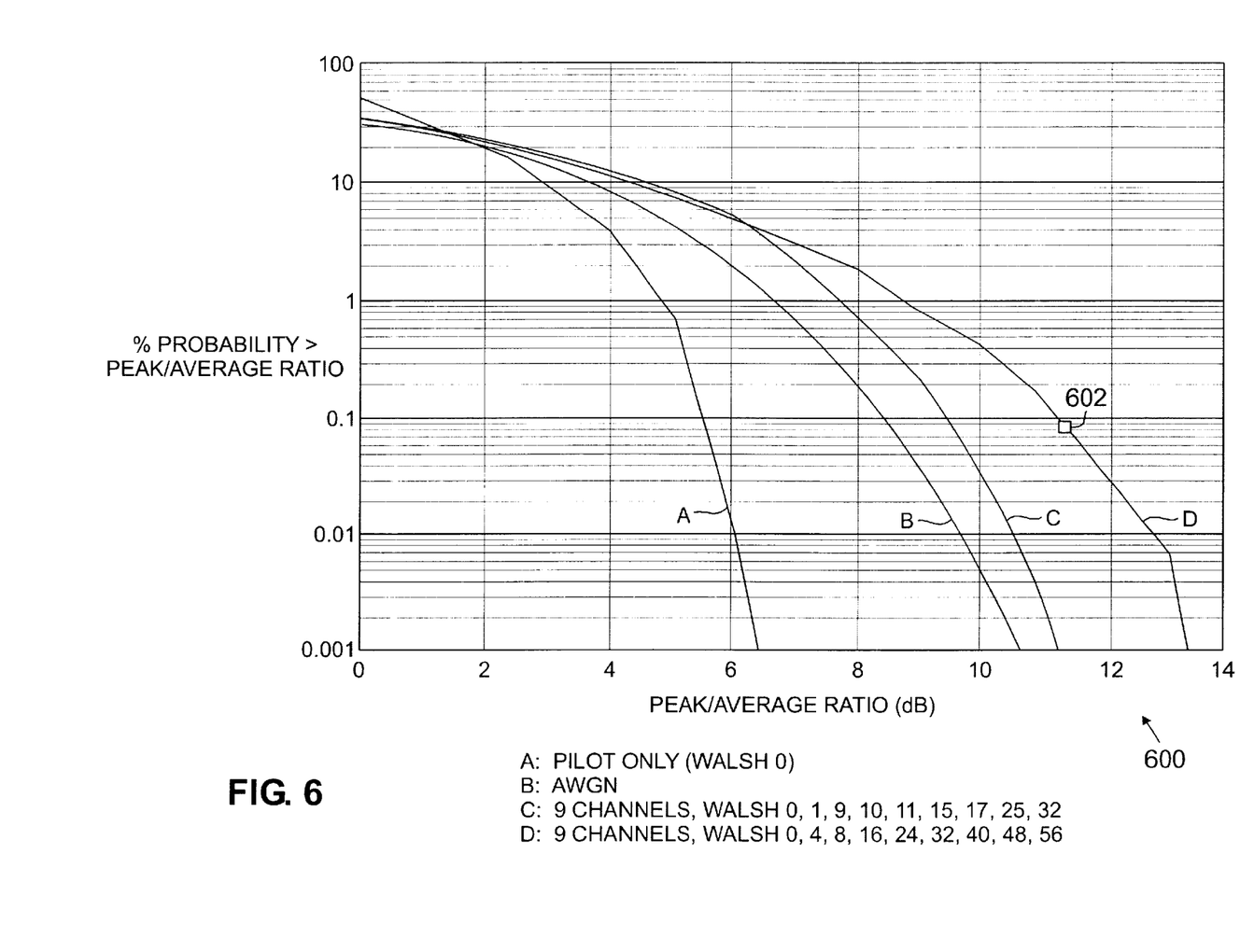
FIG. 6 is a graph that illustrates probability of observing a certain peak to average ratio in a CDMA base station RF transmitter signal.

FIG. 6 depicts graph 600 of the probability of observing a certain peak to average ratio in a CDMA base station transmit signal. For example, based on curve D, an amplifier designed for a CDMA output power of 10 W (40 dBm) would need to have a peak power capability of approximately 125 W (51 dBm) to accommodate the large peaks that occur in the input signal. The probability of occurrence of signal peaks 602 being greater than 11 dB above the average power is less than 0.1%.

Power amplifiers with large backoffs exhibit extremely poor efficiency. A power amplifier's greatest efficiency is achieved at higher power levels nearest P1 db, the gain compression point. Efficiency decreases proportional to the square root of $P_{out}$ in class AB operation with reduced power levels (increased backoff) and increased power consumption.

There is therefore a need in the art for an improved base station power amplifier capable of handling short term power increases. In particular, there is a need in the art for a power amplifier with improved power amplification efficiency and decreased power consumption.

SUMMARY OF THE INVENTION

To address the above-discussed deficiencies of the prior art, it is a primary object of the present invention to provide, for use in a base station power amplifier, a first and second amplifier stage for amplifying a received RF signal. A controller is provided that samples the incoming signal to determine its power level. If the signal power level is below a predetermined threshold, the controller directs the signal to the first amplifier stage which provides low power amplification. If the signal is above the threshold, the controller passes the signal to the second amplifier stage which provides high power amplification.

In an advantageous embodiment of the present invention a first set of pin-diode switches in conjunction with quarter-wavelength lines is provided for opening and closing a radio frequency input for the first amplifier.

According to one embodiment of the present invention, a second set of pin-diode switches in conjunction with quarter-wavelength lines is used for opening and closing the radio frequency input for said second amplifier.

According to another embodiment of the present invention, a detection circuit is utilized for sampling an incoming radio frequency signal to determine a power level of the signal and a time delay circuit delays the signal so that the controller is able to make switching decisions.

According to still another embodiment of the present invention, a switch is provided for switching the RF signal to either the first amplifier or the second amplifier depending on the power level of the incoming signal. If the power level is below a predetermined threshold, the signal is passed through the main, first, amplifier stage. If the power level is above the threshold, the signal is passed through the second amplifier stage.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged wireless office network.

Figure 1:
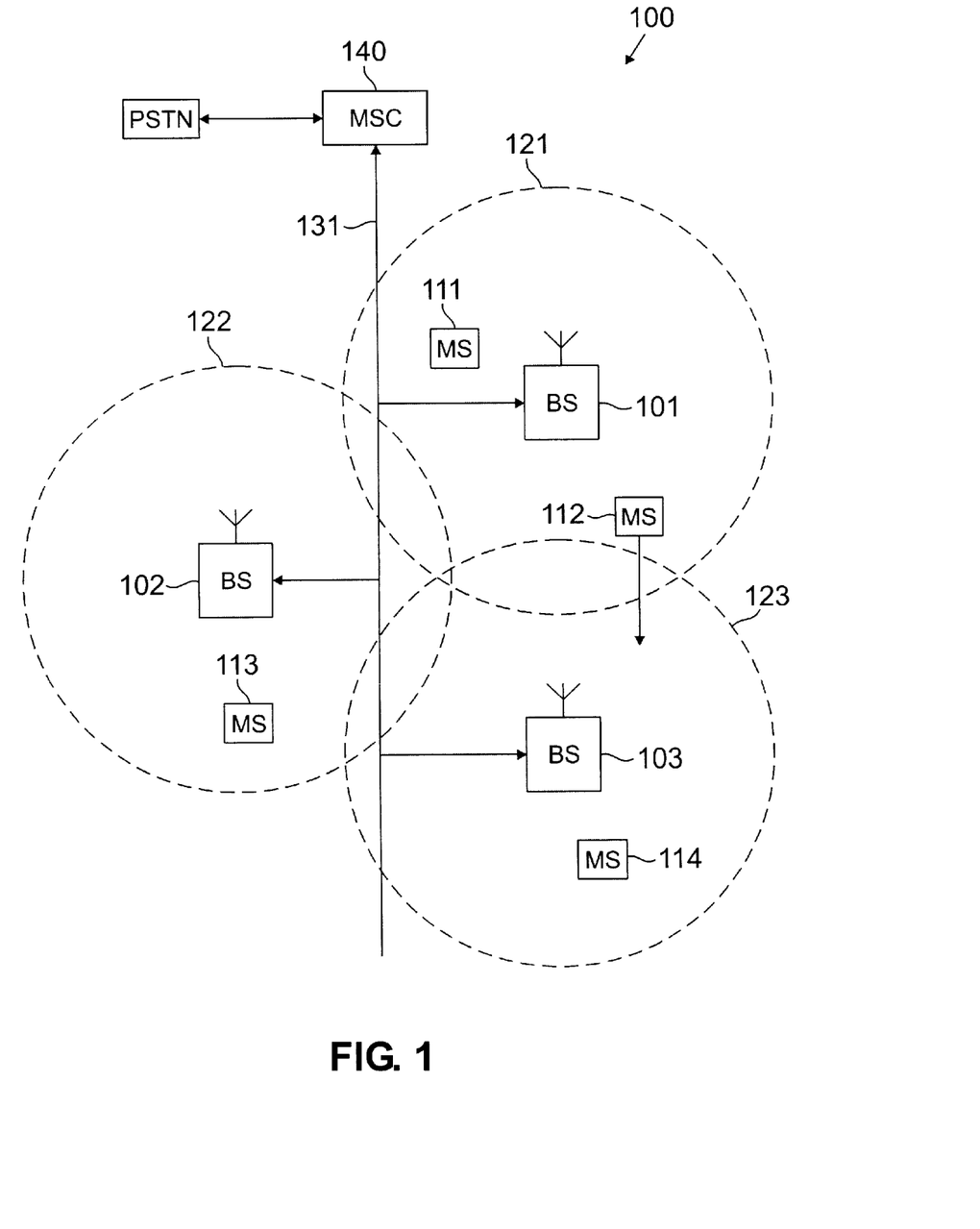
FIG. 1 illustrates a general overview of an exemplary wireless network according to one embodiment of the present invention.

FIG. 1 illustrates a general overview of exemplary wireless network 100 according to an embodiment of the present invention. Wireless network 100 comprises a plurality of cell sites 121–123, each containing one of the base stations, BS 101, BS 102, or BS 103. Base stations 101–103 are operable to communicate with a plurality of mobile stations (MS) 111–114. Mobile stations 111–114 may be any suitable wireless communication devices, including conventional cellular telephones, PCS handset devices, portable computers, telemetry devices, and the like.

Dotted lines show the approximate boundaries of the cell sites 121–123 in which base stations 101–103 are located. The cell sites are shown approximately circular for the purposes of illustration and explanation only. It should be clearly understood that the cell sites also may have irregular shapes, depending on the cell configuration selected and both natural and man-made obstructions.

In one embodiment of the present invention, BS 101, BS 102, and BS 103 each may comprise a base station controller (BSC) and a base transceiver station (BTS). Base station controllers and base transceiver stations are well known to those skilled in the art.

A base station controller is a device that manages wireless communications resources, including the base transceiver station, for specified cells within a wireless communications network. A base transceiver station comprises the RF transceivers, antennas, and other electrical equipment located in each cell site. This equipment may include air conditioning units, heating units, electrical supplies, telephone line interfaces, RF transmitters and RF receivers and signal amplifiers as well as call processing circuitry. For the purpose of simplicity and clarity in explaining the operation of the present invention, the base transceiver station in each of cells 121, 122, and 123 and the base station controller associated with each base transceiver station are collectively represented by BS 101, BS 102 and BS 103, respectively.

BS 101, BS 102 and BS 103 transfer voice and data signals between each other and the public telephone system (not shown) via communications line 131 and mobile switching center (MSC) 140. Mobile switching center 140 is well known to those skilled in the art. Mobile switching center 140 is a switching device that provides services and coordination between the subscribers in a wireless network and external networks, such as the public telephone system and/or the Internet. Communications line 131 may be any suitable connection means, including a T1 line, a T3 line, a fiber optic link, a network backbone connection, and the like. In some embodiments of the present invention, communications line 131 may be several different data links, where each data link couples one of BS 101, BS 102, or BS 103 to MSC 140.

In the exemplary wireless network 100, MS 111 is located in cell site 121 and is in communication with BS 101, MS 113 is located in cell site 122 and is in communication with BS 102, and MS 114 is located in cell site 123 and is in communication with BS 103. MS 112 is also located in cell site 121, close to the edge of cell site 123. The direction arrow proximate MS 112 indicates the movement of MS 112 towards cell site 123. At some point, as MS 112 moves into cell site 123 and out of cell site 121, a "handoff" will occur.

As is well known, the "handoff" procedure transfers control of a call from a first cell to a second cell. "Soft" handoff, is a type of handoff, that provides for a transfer between cells (base stations) without notice to the MS 112 user. For example, if MS 112 is in communication with BS 101 and senses that the signal from BS 101 is becoming unacceptably weak, MS 112 may then switch to a BS that has a stronger signal, such as the signal transmitted by BS 103. MS 112 and BS 103 establish a new communication link and a signal is sent to BS 101 and the public telephone network to transfer the on-going voice, data, or control signals through BS 103. The call is thereby seamlessly transferred from BS 101 to BS 103. An "idle" handoff is a handoff between cells of a mobile device that is communicating in the control or paging channel, rather than transmitting voice and/or data signals in the regular traffic channels.

Figure 2:
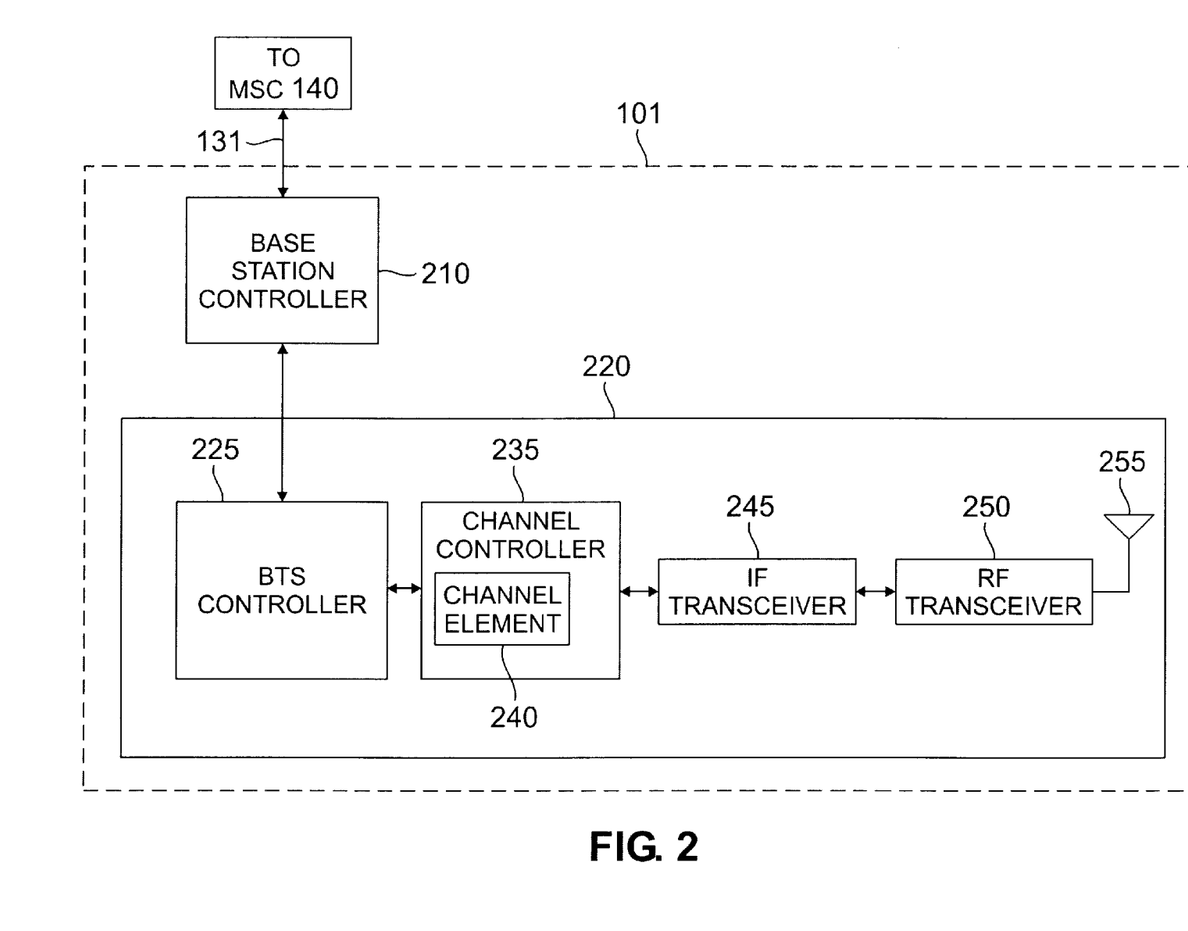
FIG. 2 depicts in greater detail an exemplary base station in accordance with one embodiment of the present invention.

FIG. 2 depicts, in greater detail, exemplary base station 101 in accordance with one embodiment of the present invention. Base station 101 comprises base station controller (BSC) 210 and base transceiver station (BTS) 220. Base station controllers and base transceiver stations were described previously in connection with FIG. 1. BSC 210 manages the resources in cell site 121, including BTS 220. BTS 220 comprises BTS controller 225, channel controller 235, which contains representative channel element 240, transceiver interface (IF) 245, RF transceiver unit 250 and antenna array 255.

BTS controller 225 comprises processing circuitry and memory capable of executing an operating program that controls the overall operation of BTS 220 and communicates with BSC 210. Under normal conditions, BTS controller 225 directs the operation of channel controller 235, which contains a number of channel elements, including channel element 240, that perform bi-directional communications in the forward channel and the reverse channel. A "forward" channel refers to outbound signals from the base station to the mobile station and a "reverse" channel refers to inbound signals from the mobile station to the base station. In an advantageous embodiment of the present invention, the channel elements operate according to a code division multiple access (CDMA) protocol with the mobile stations in cell 121. Transceiver IF 245 transfers the bi-directional channel signals between channel controller 235 and RF transceiver unit 250 which includes signal amplifier 251 for amplifying the bi-directional signals.

Figure 3:
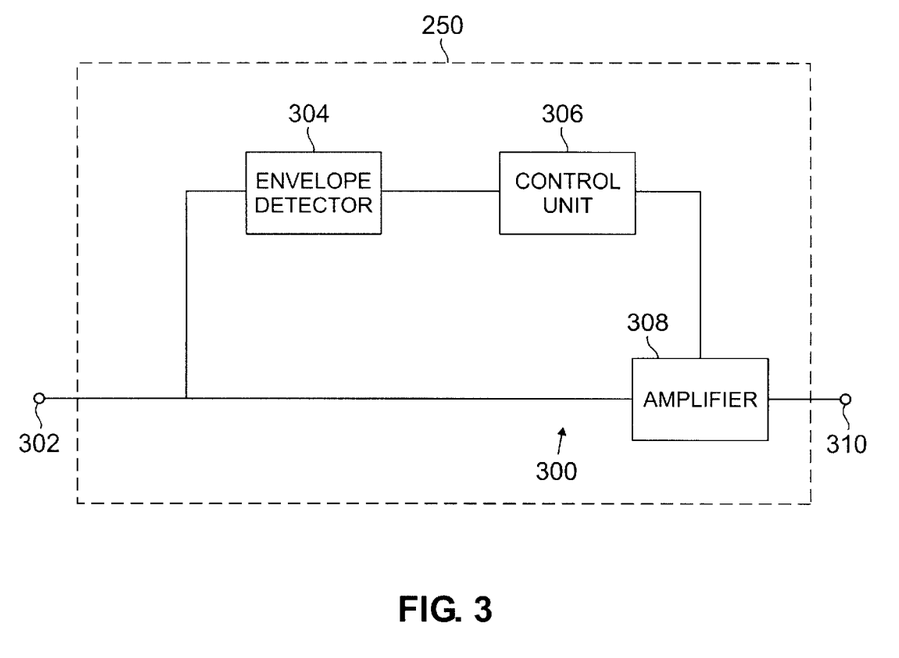
FIG. 3 illustrates a high-level block diagram of a signal amplifier circuit in accordance with an embodiment of the present invention.

FIG. 3 illustrates a block diagram of a signal amplifier, in accordance with the present invention. Signal amplifier 308 receives an RF signal at input 302. The input signal is coupled to envelope detector 304 and the power level of the input signal is detected. Envelope detector 304 is coupled to control unit 306, which receives a signal from envelope detector 304 representing the power level of the input signal. The instantaneous power level of the input signal, determined by envelope detector 304, is used by control unit 306 to determine the adjustment needed to provide the proper amount of power amplification. Control unit 306 adjusts supply and bias voltage levels of amplifier 308 in response to the detected power level of the input signal. Amplifier 308 is coupled to input 302 for receiving the input signal to be amplified. Amplifier 308 produces an amplified output signal at an output 310.

Figure 4:
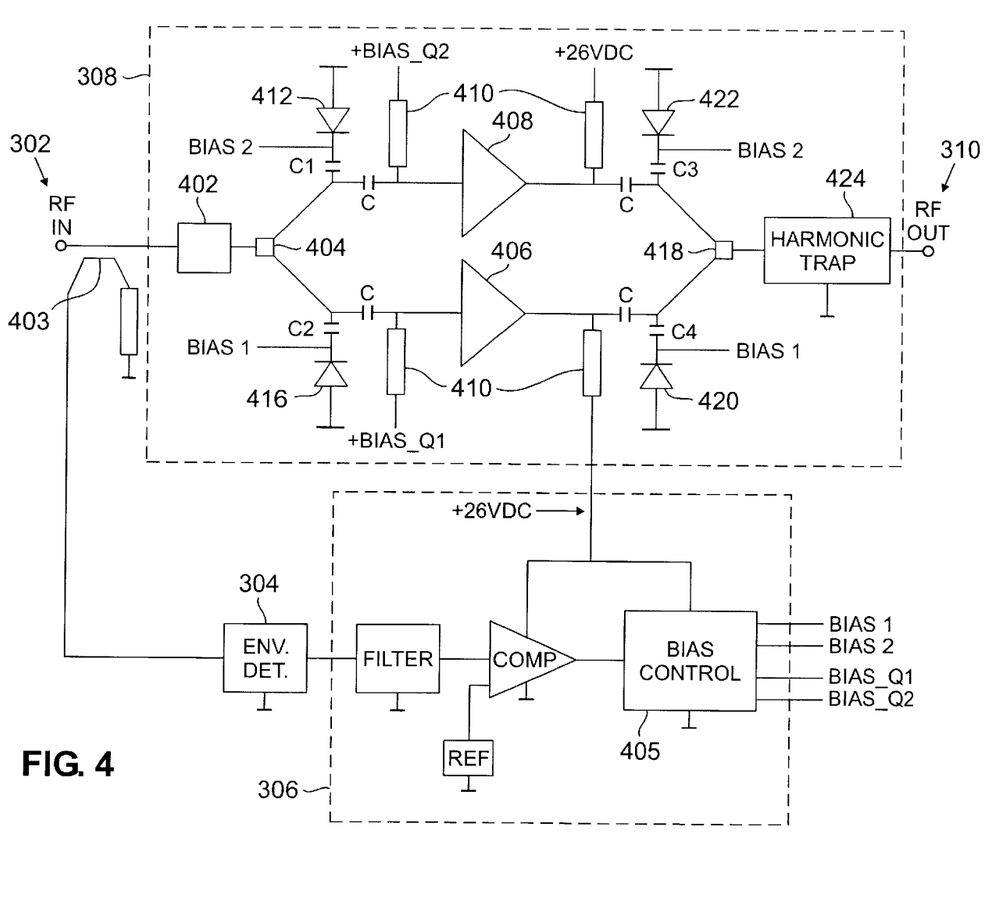
FIG. 4 depicts a circuit diagram of an amplifier configuration and controller according to one embodiment of the present invention.

FIG. 4 depicts a circuit for amplifying an input signal according to an embodiment of the present invention. The amplifier comprises amplifier stage 406 (main amplifier) which may process a radio frequency (in this instance, CDMA) signal during times when the signal has a low peak power component. The amplifier comprises a second amplifier stage 408 which may process a CDMA signal when incoming signal 302 (RF-IN) has a high peak power component. For example, if amplifier stage 406 is designed for an average CDMA input power of 1 W, and a threshold is set for a 3 dB peak/average ratio, then all signals above 2 W (3 dB) will be handled by amplifier stage 408, and all signals below the 2 W threshold will be processed by amplifier stage 406. In this way, amplifier stage 406, the main amplifier, operates greater than 85% of the time (depending on design) with very little backoff. This permits power amplifier 308 to operate much closer to the optimum efficiency point, P1 dB. If either amplifier stage 406 or 408 is not processing a signal, then the non-operating amplifier stage is automatically switched off to save power consumption.

A CDMA signal may be amplified utilizing the present invention. The signal is received at input RF-IN 302. The signal propagates toward time delay (τ) element 402. A portion of the signal is split off, or sampled, via directional coupler line 403 for signal processing by controller 306 which is an integral part of amplifier 308. The main signal is delayed at time delay element 402 according to a pre-set time, just long enough to give the signal processing circuitry time to make decisions and switch in the appropriate amplifier stage.

After passing time delay element 402, the signal propagates toward input splitter 404. Quarter-wavelength lines 410 in conjunction with pin-diode switches appear as an open circuit when the diode is switched "ON." Pin-diodes are comprised of P-doped and N-doped layers sandwiched about a region referred to as "intrinsic" and are useful for switching and attenuating RF signals. When a pin-diode is conducting forward bias current, it will also conduct a high frequency signal superimposed on the bias current. There is very little signal distortion and pin-diode 412 acts like a variable resistor, e.g., resistance decreases as bias current increases. In normal operation the input signal power, $P_{in}$, is less than the threshold power $P_{threshold}$ and high power amplifier stage 408 is shut off by removing bias voltage, which is imposed by controller 306. Bias controller 405, in response to the sampled input signal, applies a bias to pin-diode and quarter-wavelength line 410 combinations to toggle the combinations on and off according to the sample received. Diode 412 is biased ON so amplifier stage 408 appears as an open circuit to any signal. Diode 416 is biased off so that amplifier stage 406 appears to have a 50 ohm resistance and the signal propagates toward amplifier stage 406.

The amplified signal propagates to output combiner 418. At combiner 418, diode 420 is toggled off so that the signal sees a nominal 50 ohm impedance and diode 422 is biased ON so that the amplifier stage 408 appears to be an open circuit. Thus, no signal propagates into amplifier stage 408. After passing combiner 418, the signal propagates through harmonic trap 424. Harmonic trap 424 removes harmonics that may have been introduced during amplifier switching (another embodiment may substitute a filter for harmonic trap 424 and accomplish the same result).

For input power $P_{in} > P_{threshold}$, the operation is similar except that now amplifier stage 406 is biased off and the amplifier stage 408 is biased on. Amplifier stage 408 processes the RF-IN signal exactly as the amplifier stage 406 described previously.

The signal processing circuitry, composed of an envelope detector, filter, comparator, reference, and bias control circuit, processes an input signal to determine exactly when to switch between amplifier stages, when to turn amplifier bias on or off, and to shape the turn-on or turn-off transfer functions of the pin-diodes to reduce spurious responses during switching. By utilizing the two amplifier stages, reduced power consumption and increased signal power amplification is thus achieved with the two stage amplifier.

Figure 5:
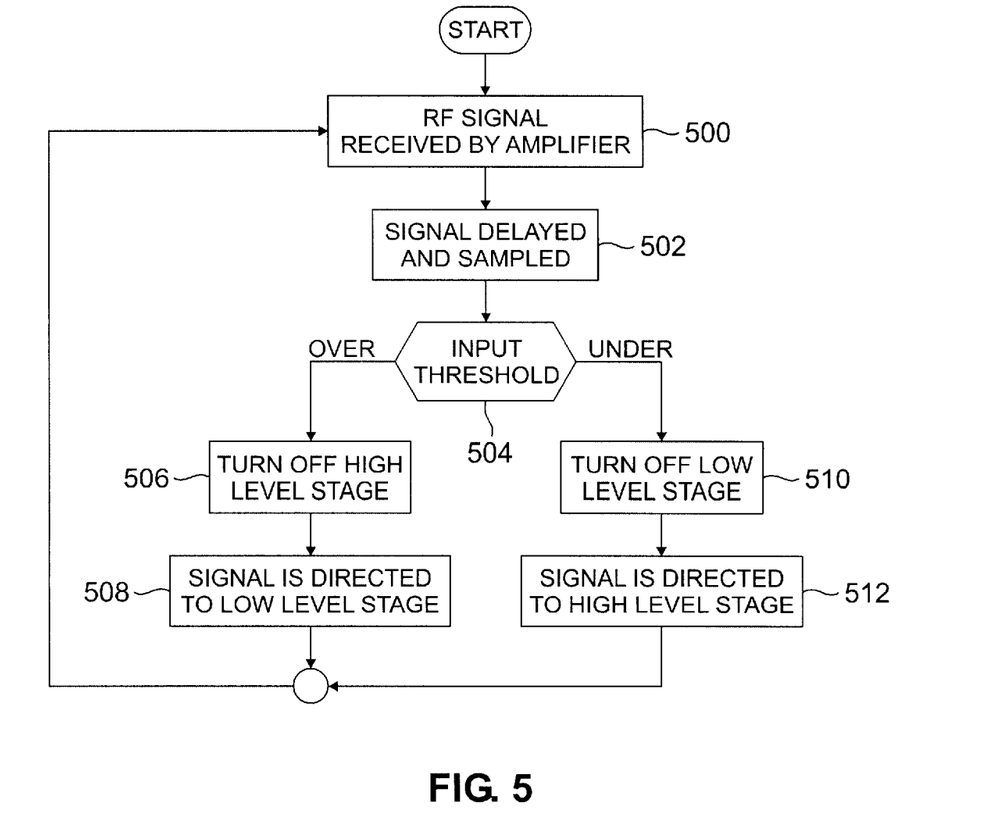
FIG. 5 depicts a method for improving the operation of a signal amplifier according to an embodiment of the present invention.

FIG. 5 depicts a method for improving the operation of a signal amplifier according to an embodiment of the present invention. The process begins with reception of a signal to be amplified (process step 500). The signal is delayed and during the delay, the signal is sampled and the results are transmitted to the controller, as described above (process step 502). A predetermined level has been set that the incoming signal is measured against. The determination is made whether the signal is below or above the predetermined level (process step 504).

If the determination is made that the signal is above the predetermined level, the controller applies a bias to a first pin-diode and quarter-wavelength line combination. When the first combination is biased, the incoming signal sees the combination as an open circuit (process step 506). At the same time, the controller biases a second pin-diode and quarter-wavelength combination that looks like a 50 ohm impedance to the incoming signal. The incoming signal is then directed to the high level amplifier stage (process step 508).

If the determination is made, in step 504, that the incoming signal is below a predetermined power level the controller applies a bias to a second pin-diode and quarter-wavelength line combination. When the second combination is biased, the incoming signal sees the second combination as an open circuit (process step 510). At the same time, the controller biases the first pin-diode and quarter-wavelength combination that looks like a 50 ohm impedance to the incoming signal. The incoming signal is then directed to the low level amplifier stage (process step 512). The process repeats for every incoming signal.

Although the present invention has been described in detail, those skilled in the art should understand that they can make various changes, substitutions and alterations herein without departing from the spirit and scope of the invention in its broadest form.

What is claimed is:

1. For use in a base station of a wireless communications network, a system for enhancing power amplifier efficiency comprising:

a first amplifier stage and a second amplifier stage for amplifying received signal; and a controller for directing said signal to one of said first and second amplifier stages according to a predetermined threshold, wherein said controller comprises a first set of pin-diode switches in conjunction with quarter-wavelength lines for opening and closing a radio frequency input for said first amplifier stage.

2. The system as set forth in claim 1, further comprising a second set of pin-diode switches in conjunction with quarter-wavelength lines for opening and closing said radio frequency input for said second amplifier stage.

3. The system as set forth in claim 1, further comprising a time delay circuit for delaying a radio frequency signal.

4. The system as set forth in claim 1, further comprising:
   a detection circuit for sampling said radio frequency signal to determine a power level of said signal; and
   a switch for switching said signal to one of said first amplifier stage and said second amplifier stage.

5. The system as set forth in claim 4, further comprising a circuit for switching said incoming signal to said first amplifier stage for processing radio frequency signals below a predetermined power level.

6. The system as set forth in claim 4, further comprising a circuit for switching said incoming signal to said second amplifier stage for processing said radio frequency signals above a predetermined power level.

7. A wireless communications network comprising:
   a plurality of base stations capable of communicating with a plurality of mobile stations disposed in a coverage area of said wireless communications network, wherein at least one of said base stations comprises a system for enhancing power amplifier efficiency, said system comprising:
      a first amplifier stage and a second amplifier stage for amplifying a received signal; and
      a controller for directing said signal to one of said first and second amplifier stages according to a predetermined threshold, wherein said controller comprises a first set of pin-diode switches in conjunction with quarter-wavelength lines for opening and closing a radio frequency input for said first amplifier stage.

8. The wireless communications network as set forth in claim 7, further comprising a second set of pin-diode switches in conjunction with quarter-wavelength lines for opening and closing said radio frequency input for said second amplifier stage.

9. The wireless communications network as set forth in claim 7, further comprising:
   a time delay circuit for delaying a radio frequency input signal; and
   a sampling circuit for determining the power level of said input signal.

10. The wireless communications network as set forth in claim 7, further comprising:
    a detection circuit for sampling an incoming radio frequency signal to determine a power level of said signal; and
    a switch for switching said radio frequency signal to one of said first amplifier stage and said second amplifier stage.

11. The wireless communications network as set forth in claim 7, further comprising a circuit for switching said incoming signal to said first amplifier stage for processing radio frequency signals below a predetermined power level.

12. The wireless communications network as set forth in claim 7, further comprising a circuit for switching said incoming signal to said second amplifier stage for processing said radio frequency signals above a predetermined power level.

13. For use in a base station of a wireless communications network, a method for improving power amplifier efficiency comprising the steps of:
    receiving a signal to be amplified;
    determining a power level of the signal;
    comparing the signal power level to a predetermined threshold;
    if the signal power level is below the predetermined threshold, passing the signal to a first amplifier stage utilizing a first set of quarter wave-length lines in conjunction with pin-diode switches; and
    if the signal power level is above the predetermined threshold, passing the signal to a second amplifier stage.

14. The method for improving power amplifier efficiency as set forth in claim 13 further comprising the step of delaying the signal and determining the power of the input signal.

15. The method for improving power amplifier efficiency as set forth in claim 13 wherein the step of passing the signal to a second amplifier stage utilizes a second set of quarter wave-length lines in conjunction with pin-diode switches.

16. The method for improving power amplifier efficiency as set forth in claim 13 further comprising the step of switching the signal to the first amplifier stage for processing, responsive to a detected peak power component below a predetermined threshold.

17. The method for improving power amplifier efficiency as set forth in claim 13 further comprising the step of directing the signal to the second amplifier stage for processing, responsive to a detected peak power component above a predetermined threshold.

* * * * *